US005502416A

United States Patent [19]

Pietrobon

[11] Patent Number: 5,502,416

[45] Date of Patent: Mar. 26, 1996

[54] ADJUSTABLE RESET THRESHOLD FOR AN INTEGRATED REGULATOR

[75] Inventor: Giovanni Pietrobon, Novi, Mich.

[73] Assignee: SGS-Thomson Microelectronics, Inc., Carrollton, Tex.

[21] Appl. No.: 414,779

[22] Filed: Mar. 31, 1995

[51] Int. Cl.[6] .................... H03K 5/08

[52] U.S. Cl. .................... 327/538; 327/316; 327/323; 327/561

[58] Field of Search .................... 327/316, 323, 327/561, 538

[56] References Cited

U.S. PATENT DOCUMENTS 4,847,549 7/1989 Suzuki .................... 327/538
5,115,152 5/1992 Nishimura .................... 327/561

OTHER PUBLICATIONS

*Electronic Engineering* Dec. 1974 pp. 23 and 25.

*Primary Examiner*—Margaret R. Wambach
*Attorney, Agent, or Firm*—Renee M. Larson; Lisa K. Jorgenson; Richard K. Robinson

[57] ABSTRACT

According to the present invention, an integrated regulator having an adjustable reset threshold is disclosed. The integrated regulator has the following elements contained within an integrated circuit device: a transistor, a voltage reference block, an internal resistive network, an operational amplifier which regulates the voltage output signal of the integrated regulator by regulating the base current of the transistor, and a comparator which senses and communicates to the user when the operational amplifier is unable to maintain the voltage output signal within an acceptable range of a desired value of the voltage output signal. External to the integrated circuit device is an external resistive network. When the reset output signal of the integrated regulator is equal to an active state, this is indicative that the operational amplifier has been unsuccessful in keeping the voltage output signal within the acceptable range of the desired value of the voltage output signal, i.e. the voltage output signal has fallen below the reset threshold or trip point of the integrated regulator. When the voltage output signal is back within the acceptable range of the desired value of the voltage output signal, the reset output signal of the integrated regulator is equal to an inactive state. The reset threshold of the integrated regulator may be easily and readily programmed by adjusting the external resistive network.

20 Claims, 3 Drawing Sheets

10'

ADJUSTABLE RESET THRESHOLD FOR AN INTEGRATED REGULATOR

BACKGROUND OF THE INVENTION

1. Field of the Invention

The present invention relates generally to integrated regulator technology, and more specifically to an integrated regulator having an adjustable reset threshold.

2. Description of the Prior Art

A wide variety of situations require that a desired voltage value be maintained or supplied to a given system or application. Often, this voltage value must be within a strictly defined tolerance of the desired voltage value. A case in point is a microprocessor-based system where it is key that voltages supplied to the microprocessor be within rigidly defined limits in order to avoid false triggering of data to the microprocessor.

Referring to FIG. 1, a schematic diagram of an integrated regulator, according to the prior art, is shown. As indicated by the dashed lines of FIG. 1, the elements of the integrated regulator are contained within an integrated circuit device. The elements of the integrated regulator 10 of FIG. 1 include a Transistor 20, an Op Amp 22 (operational amplifier), a comparator 24, a Voltage Reference block 26, and resistive elements, resistors R3, R4, R5 and R6. Voltage is supplied to the integrated regulator via the Voltage In pad 12 to transistor 20, the voltage output signal 15 of the integrated regulator, Vout, is available through the Voltage Out pad 14, and the Reset Out signal 25 is available through the Reset Out pad 18. The logic state of Reset Out signal 25 on pad 18 is produced by comparator 24 and is indicative of whether voltage output signal 25 has violated the reset threshold of the integrated regulator. The reset threshold of integrated regulator 10 is the trip point at which a given value of voltage output signal 15 will cause the Reset Out signal 25 on pad 18 to change from a first logic state to a second logic state.

The goal of the integrated regulator is to produce a voltage output signal 15, Vout, which matches, as much as possible, the voltage of the Voltage Reference block 26, and Op Amp 22 operates to regulate voltage output signal Vout 15. The Op Amp has two input signals: the signal at Node 2, determined by the value of the resistive elements, which is provided to the negative input terminal of the Op Amp 22 and the voltage signal from the Voltage Reference block 26 which is provided to the positive input terminal of Op Amp 22. Voltage output signal Vout 15 may be monitored to determine whether it remains within an accepted tolerance of its desired value. The value of voltage output signal Vout is given by the following equation:

$$\text{OUT} = \frac{V_{ref} \cdot (R_3 + R_4 + R_5 + R_6)}{R_4} \quad (1)$$

where Vref is equal to the voltage signal produced by the Voltage Reference block and supplied to the positive input terminal of the Op Amp.

While Op Amp 22 actually performs regulation of voltage output signal 15, comparator 24 senses whether voltage output signal 15 is being properly regulated, and if it is not, communicates this information via the Reset Out signal 25 on pad 18. Thus the logic state (either active or inactive) of Reset Out signal 25 on pad 18 indicates whether voltage output signal 15 has crossed the trip point of the regulated integrator, called the reset threshold. If Op Amp 22 is not regulating properly, such as when voltage output signal 15 is lower than the reset threshold of integrated regulator 10, the reset threshold, referred to as $\text{RESET}_{OFF}$, is given by the following equation:

$$\text{RESET}_{OFF} = \frac{V_{ref} \cdot (R_3 + R_4 + R_5 + R_6)}{(R_4 + R_5 + R_6)} \quad (2)$$

Shorting out resistive element R5 is shorted out then the equation becomes:

$$\text{RESET}_{OFF} = \frac{V_{ref} \cdot (R_3 + R_4 + R_6)}{(R_4 + R_6)} \quad (3)$$

Resistive element R5 must have a value greater than 0 Ohms to introduce hysteresis to comparator 24.

As an example, customer using the integrated regulator in a microprocessor system may require that the desired value of voltage output signal Vout be 5 volts and further that the voltage output signal Vout may only deviate from 5 volts by ±0.2 volts; otherwise, a Vout value not within this tolerance range may cause the microprocessor to falsely trigger incorrect data states. Thus, in this example, voltage output signal Vout is within acceptable limits only so long as its value remains in the range from 4.8 volts to 5.2 volts; the trip points, then of integrated regulator 10, are 4.8 volts and 5.2 volts. When Op Amp 22 has not been successful at regulation, voltage output signal Vout 15 becomes an unacceptable value, i.e. less than 4.8 volts or greater than 5.2 volts, and it may be brought back within the accepted tolerance by making internal adjustments to resistive elements R3, R4, R5 and R6. When voltage output signal 15 has passed the reset threshold trip point, then Reset Out signal 25 produced by comparator 24 becomes active (a logic low voltage level on pad 18) and thus communicates to the user that voltage output signal 15 is out of regulation.

While the integrated regulator 10 of FIG. 1 has Op Amp 22 for regulating voltage output signal 15 and comparator 24 for sensing whether Op Amp 22 is keeping voltage output signal 15 within regulation, a major shortcoming of integrated regulator 10 is that it does not provide a way for easily and readily adjusting the reset threshold, or trip point, as desired or when necessary. Thus a user of integrated circuit 10, perhaps a customer of a semiconductor manufacturer, must make do the reset threshold of the integrated regulator chosen by the manufacturer since the reset threshold of the device is not easily and readily adjustable.

SUMMARY OF THE INVENTION

It would be advantageous in the art to be able to readily and easily adjust the reset threshold, or trip point, of an integrated.

Therefore, according to the present invention, an integrated regulator having an adjustable reset threshold is disclosed. The integrated regulator has the following elements contained within an integrated circuit device: a transistor, a voltage reference block, an internal resistive network, an operational amplifier which regulates the voltage output signal of the integrated regulator by regulating the base current of the transistor, and a comparator which senses and communicates to the user when the operational amplifier is unable to maintain the voltage output signal within an acceptable range of a desired value of the voltage output signal. External to the integrated circuit device is an external resistive network. It is desirable that the comparator have hysteresis so that the integrated regulator may operate in noisy environments. According to a first preferred embodiment of the invention, a three-input comparator having hysteresis is used to provide a relatively large hysteresis factor. According to a second preferred embodiment of the invention, a two-input comparator (operational amplifier) is used to provide a relatively small hysteresis factor.

When the reset output signal of the integrated regulator is equal to an active state, this is indicative that the operational amplifier has been unsuccessful in keeping the voltage output signal within the acceptable range of the desired value of the voltage output signal, i.e. the voltage output signal has fallen below the reset threshold or trip point of the integrated regulator. When the voltage output signal is back within the acceptable range of the desired value of the voltage output signal, the reset output signal of the integrated regulator is equal to an inactive state. The reset threshold of the integrated regulator may be easily and readily programmed by adjusting the external resistive network.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The present invention overcomes a shortcoming of the prior art by providing circuitry for easily and readily adjusting the reset threshold, or trip point, of an integrated regulator as desired. As an example, a first customer who is using an integrated regulator in a microprocessor system may require that the desired value of a voltage output signal of the integrated regulator be 5 volts, ±0.2 volts in order to avoid false triggering of data states of the microprocessor. A second customer who is using an integrated regulator in a different application, however, may require that the integrated regulator produce a voltage output signal of 5 volts, ±0.8 volts. The first customer, who has an acceptable tolerance of 5 volts, ±0.2 volts, has a relatively larger hysteresis requirement than the second customer who has an acceptable tolerance of 5 volts, ±0.8 volts. However, both customers may use the integrated regulator of the present invention since external adjustment circuitry allows the reset threshold to be adjusted as desired. Thus, using the present invention the first customer may adjust the reset threshold to be approximately 4.8 volts and the second customer may adjust the reset threshold to be approximately 4.2 volts.

Figure 1:
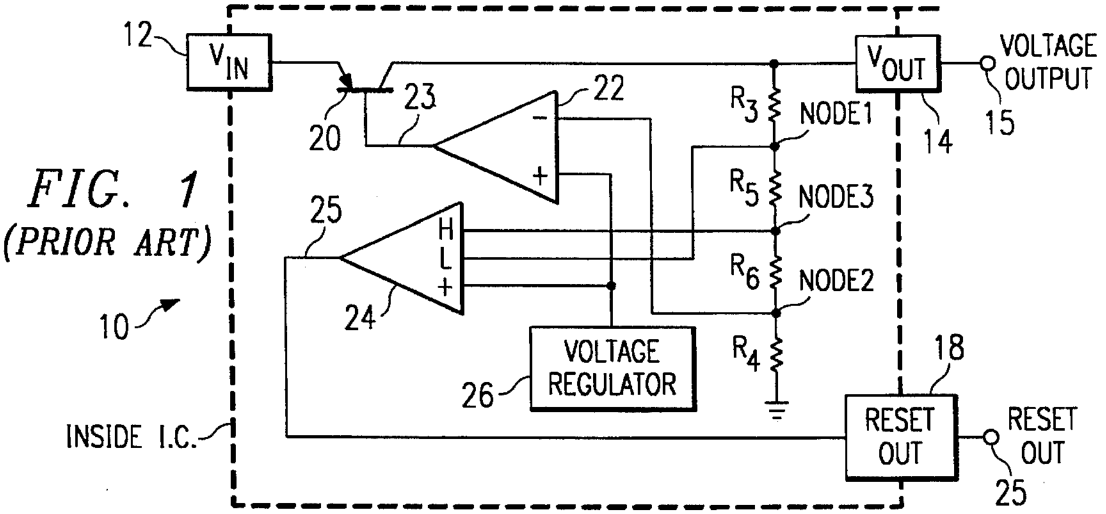
FIG. 1 (PRIOR ART)
FIG. 1 is a schematic diagram of an integrated regulator, according to the prior art.
Figure 2:
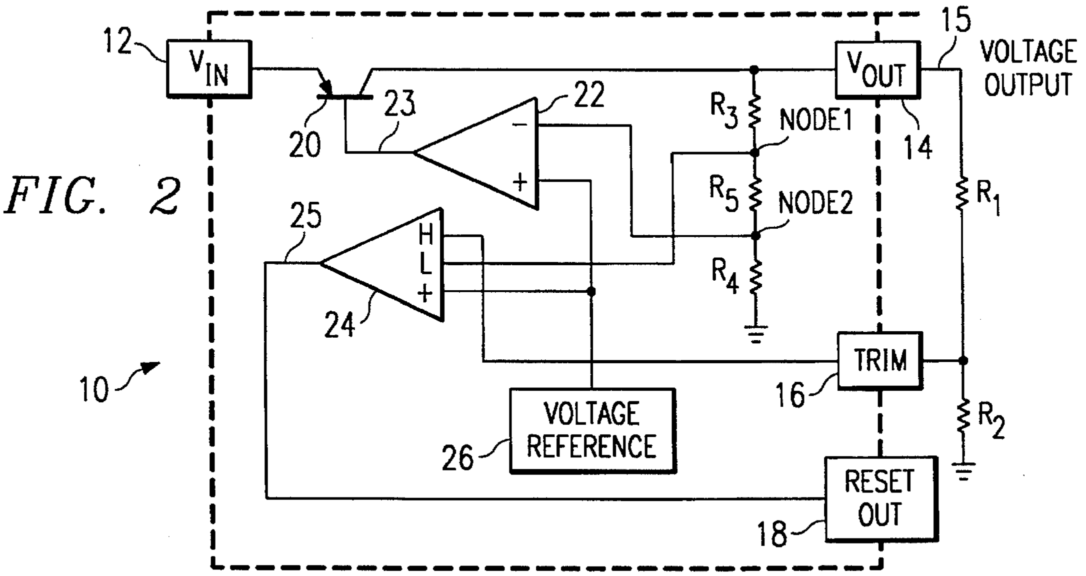
FIG. 2 is a schematic diagram of an integrated regulator having an adjustable reset threshold, according to a first embodiment of the present invention.

Referring to FIG. 2, a schematic diagram of an integrated regulator 10 having an adjustable reset threshold, according to a first embodiment of the present invention, is shown. The elements of the integrated regulator inside the dashed lines are contained within an integrated circuit device while the remaining circuitry outside the dashed lines are outside the integrated circuit device.

The integrated circuit device has several pads through which circuitry inside the integrated circuit device may communicate with circuitry outside the integrated circuit device. $V_{IN}$ pad 12 is the pad through which voltage from an external power supply is supplied to the integrated circuit device. Voltage output signal 15 is the output signal of integrated regulator 10 and is present on Voltage Output Pad ($V_{OUT}$) 14. Trim pad 16 is the pad through which the reset threshold of integrated regulator 10 may be adjusted external to the integrated circuit device as desired. Finally, pad 18 is the pad through which it may be determined if voltage output signal 15 has violated the reset threshold of the integrated regulator 10. The reset threshold of integrated regulator 10 is the trip point at which a given value of voltage output signal Vout 15 will cause the Reset Out signal 25 on pad 18 to change from a first logic state to a second logic state.

The integrated regulator 10 has the following components internal to the integrated circuit device: a transistor 20, an output regulating operational amplifier (Op Amp) 22 which regulates voltage output signal 15, an operational amplifier comparator 24 which senses when Op Amp 22 is not able to properly regulate voltage output signal 15 and which produces Reset Out signal 25, a voltage reference 26 ($V_{REF}$), and a first resistive network formed by resistive elements, here shown as resistors R3, R5 and R4. Since resistors R3, R4, and R5 are fabricated on the same integrated circuit device, they share the same thermal and physical characteristics. Additionally, Additionally, transistor 20 is a PNP transistor as shown in FIG. 2, but one will recognize that a NPN or other transistor type may be equally effective with corresponding and minor changes to the circuitry of integrated regulator 10.

Figure 2A:
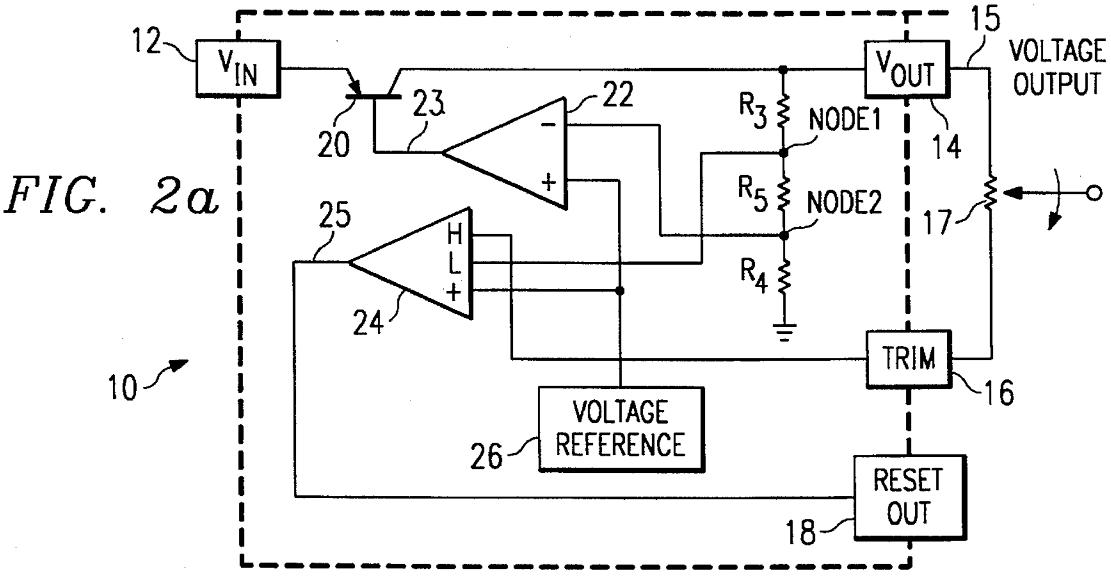
FIG. 2*a* is a schematic diagram of an integrated regulator having an adjustable reset threshold, adjustable using a potentiometer, according to the first embodiment of the present invention.

External to the integrated circuit device, i.e. outside the dashed lines, integrated regulator 10 has a second resistive network composed of resistors R1 and R2 which may be easily and externally adjusted to ensure that the value of voltage output signal 15 remains within a permissible tolerance range of a desired voltage value. Though resistors R1, R2 ideally would match the electrical characteristics of resistors R3, R5 and R4, this is not necessary since changes made to resistors R1, R2 to externally adjust the value of Reset Out signal on pad 18 are tracked by integrated regulator 10. While resistors R1, R2 are shown as a means for external changing the value of the reset threshold of the integrated regulator, it is understood that other adjusting means such as a potentiometer may be used to make the external adjustment. Referring to FIG. 2*a*, a potentiometer 17 is shown that may be used to adjust the reset threshold of integrated regulator 10.

Output regulating operational amplifier 22 is an operational transconductance amplifier (OTA) meaning that it provides an output current in response to a voltage input. The OTA bias current controls the transconductance, and allows control of the performance of the OTA. Thus, the higher the voltage of the positive (+) and negative (–) input signals of operational amplifier 22, the higher the current of its output signal 23. These operating characteristics make OTA 22 attractive for use in a wide variety of circuits such as multiplexers, sample-and-hold circuits, gain controls, modulators, multipliers, comparators, multistable circuits, etc. A PNP transistor, such as transistor 20, is normally used and an OTA will typically be used in conjunction with the PNP transistor technology. It is understood that an OTA need not be used with a transistor other than a PNP transistor is used.

Operational amplifier 22 is also known as an error amplifier since it operates to correct any error, reflected in its negative input signal at Node 2, between the value of voltage output signal 15 and its positive (+) input signal from voltage reference 26. The resistive network formed by resistors R3, R4, R5 amplifies this error at Node 2. Thus the negative input signal of operational amplifier 22 is the error input of the device. Operational amplifier 22 operates to minimize this error, such that optimally the negative (−) input signal of Op Amp 22 is equal to the positive (+) input signal of Op Amp 22. If resistors R3 and R5 are shorted, then the negative input of operational amplifier 22 is equal to voltage reference 26, such that voltage output signal 15 is equal to voltage reference 26. The voltage reference 26 can produce any desired voltage and provides a set reference voltage point for integrated regulator 10; a typical value of voltage reference 26 is approximately 1.253 volts. If resistors R3 and R5 are not shorted, then the voltage at resistor R4 (Node 2) is equal to:

$$\frac{Vout}{(R_3+R_4+R_5)\cdot(R_4)}\,. \tag{4}$$

Output regulating operational amplifier 22 moderates the base current of PNP transistor 20 and thus regulates the value of voltage output signal 15 through means of its feedback function. The value, Vout, of voltage output signal 15, is given by the following equation:

$$\mathrm{OUT}=\frac{V_{ref}\cdot(R_3+R_4+R_5)}{R_4} \tag{5}$$

While Op Amp 22 actually performs regulation of voltage output signal 15, comparator 24 senses whether voltage output signal 15 is being properly regulated, and if it is not, communicates this information via the Reset Output signal on pad 18.

Suppose that it is desired that integrated regulator 10 generate a voltage output signal 15 which is ideally equal to 5 volts. Further, assume that voltage output signal 15 will be supplied to a microprocessor and so there is a concern that voltage output signal 15 may drop below 5 volts, possibly causing false triggering of data states of the microprocessor. Thus, it is necessary to agree upon a trip point, called the reset threshold as described above, at which a given value of voltage output signal 15 will cause the Reset Out signal 25 on pad 18 to change from a first logic state to a second logic state.

Monitoring the Reset Out signal 25 on pad 18 communicates the relationship at any given time between voltage output signal 15 and the reset threshold. Reset Out signal 25 on pad 18 will remain active ($\mathrm{RESET}_{ON}$) when voltage output signal 15 has dropped below the reset threshold or integrated regulator trip point and is no longer within its acceptable range of values; thus, an active Reset Out signal 25 indicates that resistive elements R1 and R2 must be adjusted to bring voltage output signal 15 back within its acceptable range of values. Conversely, Reset Out signal 25 will remain inactive ($\mathrm{RESET}_{OFF}$) so long as voltage output signal 15 remains within its acceptable range of values. Thus the trip point of comparator 24 is defined by the equation of $\mathrm{RESET}_{OFF}$ which is shown in equation 5. Thus, $\mathrm{RESET}_{OFF}$ is always a lower value than $\mathrm{RESET}_{ON}$, as is clear from the following equations.

$$\mathrm{RESET}_{ON}=\frac{V_{ref}\cdot(R_1+R_2)}{R_2} \tag{6}$$

$$\mathrm{RESET}_{OFF}=\frac{V_{ref}\cdot(R_3+R_4+R_5)}{(R_4+R_5)} \tag{7}$$

In the previous example, suppose that the reset threshold is chosen to be 4 volts, meaning that a noise level of up to 1 volt is tolerated before integrated regulator 10 is turned off which has the effect of stopping the microprocessor. Integrated regulator 10 will remain off until the value of voltage output signal 15 is within an acceptable tolerance of the desired value of 5 volts. Thus, if the acceptable tolerance is 5 volts±0.2 volts, then Reset Out signal 25 will remain active ($\mathrm{RESET}_{ON}$) until voltage output signal 15 is greater than 4.8 volts since $\mathrm{RESET}_{ON}$ is equal to 4.8 volts. $\mathrm{RESET}_{OFF}$ is equal to 4.8 volts plus the amount of hysteresis which in this example is 0.2 volts; thus $\mathrm{RESET}_{OFF}$ is approximately equal to 5 volts. Therefore, the amount of hysteresis may be thought of as $\mathrm{RESET}_{OFF}$–$\mathrm{RESET}_{ON}$. In this manner, false triggering of the microprocessor is prevented. Thus, comparator 24 which has hysteresis has the effect of compensating for too noisy an environment. When voltage output signal 15 is at some predetermined voltage close to 5 volts, 4.8 volts for instance, a bi-stable system which remembers the previous state of voltage output signal 15 is created.

While it is not necessary that comparator 24 have hysteresis, it is desirable that it does in order to allow effective operation in noisy environments. The hysteresis of comparator 24 allows a clean Reset Out signal 25 to be produced in a noisy environment which may adversely affect the integrity of voltage output signal 15.

The typical factor of operational amplifier 22 is equal to the voltage supplied through pad 12 divided by the voltage reference 26. If the supply voltage is 5 volts and the voltage reference is approximately 1.253, for instance, then the factor of operational amplifier 22 is approximately 4. Thus, the factor of comparator 24 is the factor of operational amplifier 22 divided by the voltage reference 1.253, or approximately 3.192.

Comparator 24 is a high gain device which has three input terminals: a reference input terminal designated as the "+" terminal, a low or "L" input terminal, and a high or "H" input terminal. The reference input terminal receives a reference input signal from voltage reference 26. The low or "L" input terminal receives a signal defined at Node 1, and the high or "H" input terminal receives a signal connected to trim pad 16. Comparator 24 will choose the "H" or the "L" input signal according to the previous state of voltage output signal 15. The low "L" input of comparator 24 is noted as Y which is defined as follows:

$$Y=\frac{R4+R5}{R4+R5+R3}\,. \tag{8}$$

When the voltage of voltage output signal 15 is lower than voltage reference 26, then the output signal 25 of comparator 24 is a lower voltage. However, when voltage output signal 15 is higher than voltage reference 26, then the large (infinite) gain of comparator 24 is employed. Thus, if there is a higher current on the base of transistor 20 than reference voltage 26, then voltage output signal 15 will increase and the voltage on resistor R4 correspondingly increases such that the base current of PNP transistor 20 is lowered to the correct value. The "L" input signal of comparator 24 is adjusted downward so that Reset Out signal 25 at pad 18 is equal to a logic low level (active low).

As previously discussed, the integrated regulator 10 of FIG. 2 provides a large hysteresis characteristic where the value of voltage output signal 15 is ideally 5 volts but may vary ±0.2 volt and still be within an accepted tolerance. Often, a smaller hysteresis characteristic is desired and may be accomplished with the present invention. Suppose, for example that rather than 5±0.2 volts, it is desired that the integrated regulator provide a voltage output signal of 5±0.8 volts, with a reset threshold of 4 volts. Thus, when voltage output signal is equal to 4 volts, Reset Out signal is active (logic low) whereas at 4.2 volts Reset Out signal is inactive (logic high).

An important aspect of the invention is that the reset threshold of integrated regulator 10, defined as the trip point at which a given value of voltage output signal Vout 15 will cause Reset Out signal 25 to change from a first logic state to a second logic state, may be easily and readily changed by making appropriate adjustments to the second resistive network composes of resistors R1 and R2. Thus, changes made to the value of resistors R1 and/or R2 allow the trip point at which Reset Out signal 25 will change from an inactive to an active state, or from an active state to an inactive state, to be determined and set by the user of the integrated regulator.

Figure 3:
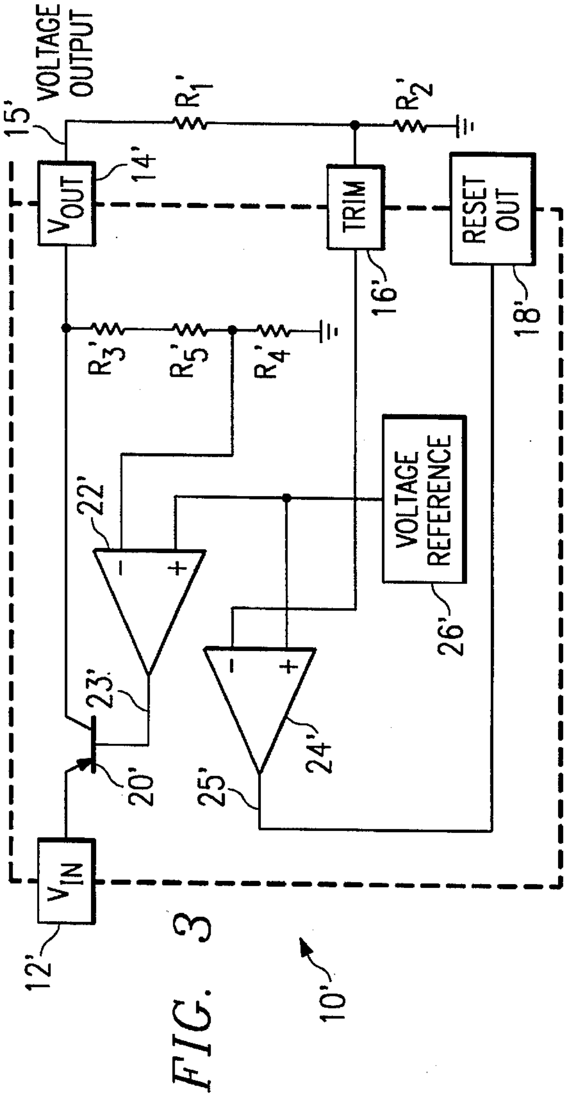
FIG. 3 is a schematic diagram of an integrated regulator having an adjustable reset threshold, according to a second embodiment of the present invention.

Referring to FIG. 3, a schematic diagram of an integrated regulator having an adjustable reset threshold, according to a second embodiment of the present invention, is shown. For this embodiment, the reset threshold may still be 4 volts but there may be a smaller hysteresis of only 200 mV (a trigger point of 4.2 volts) as compared with the larger hysteresis discussed in connection with FIG. 2. In order to obtain the smaller hysteresis factor, the three-input comparator 24 of FIG. 2 may be replaced with a two-input operational amplifier comparator 24' shown in FIG. 3 which operates as a comparator. Like comparator 24, comparator 24' may also have hysteresis either internally or external to comparator 24'. If the hysteresis is to be provided external to comparator 24', then the positive (+) input terminal of comparator 24', which is connected to voltage reference 26', may be replaced with two input terminals: a high or "H" terminal and a low or "L" terminal; both the low terminal and the high terminal would be connected to voltage reference 26' so that voltage reference 26' would have two output signals rather than the one output signal shown in FIG. 3.

The integrated circuit device has several pads through which circuitry inside the dashed lines may communicate with circuitry outside the integrated circuit device. $V_{IN}$ pad 12' is the pad through which voltage from an external power supply is supplied to the integrated circuit device. Voltage output signal 15' is the output signal of integrated regulator 10' and is present on Voltage Output Pad ($V_{OUT}$) 14'. Trim pad 16' is the pad through which the reset threshold of integrated regulator 10' may be adjusted external to the integrated circuit device as desired. Finally, pad 18' is the pad through which it may be determined if voltage output signal 15' has violated the reset threshold of the integrated regulator 10'. The Reset Out signal 25' on pad 18' may be monitored to provide a warning to the user that voltage output signal 15' is no longer within its acceptable range of values.

The integrated regulator 10'0 of FIG. 3 has components analogous with those of FIG. 3, with the exception of the three-input comparator and its associated circuitry. Those components internal to the integrated circuit device include: a transistor 20', an output regulating operational amplifier (Op Amp) 22' which regulates voltage output signal 15', an operational amplifier 24', a voltage reference 26' ($V_{REF}$), and a first resistive network formed by resistive elements, here shown as resistors R3', R5' and R4'. As in FIG. 2, since resistors R3', R4', and R5' are fabricated on the same integrated circuit device, they share the same thermal and physical characteristics. External to the integrated circuit device, i.e. outside the dashed lines, integrated regulator 10' has a second resistive network composed of resistors R1' and R2' which may be easily and externally adjusted to ensure that the value of voltage output signal 15' remains within a permissible tolerance range of a desired voltage value. While resistors R1', R2' are shown as a means for externally changing the value of the reset threshold, it is understood that other adjusting means such as a potentiometer may be used as well.

As noted above, the three-input comparator 24 of FIG. 2 has been replaced with a smaller operational amplifier 24' having a smaller hysteresis and two input terminals: a positive (+) input terminal and a negative (–) input terminal. The positive (+) input terminal of operational amplifier 24' is supplied with a voltage signal from the reference voltage block 26'. Unlike the hysteresis comparator of FIG. 2, however, the signal supplied to the negative (–) input terminal of operational amplifier 24' is directly determined by the externally adjustable resistive network formed by resistors R1' and R2', via trim pad 16'.

In order to achieve a smaller hysteresis, circuitry internal to operational amplifier 24' provides the desired hysteresis factor (circuitry not shown here) of 200 mV, in keeping with the above example. It is important to note that any other hysteresis value may be used as well. The factor of integrated regulator 10' of FIG. 3 takes into account the value of the predetermined hysteresis of 200 mV and is equal to: Factor= Y+200 mV.

Figure 4A:
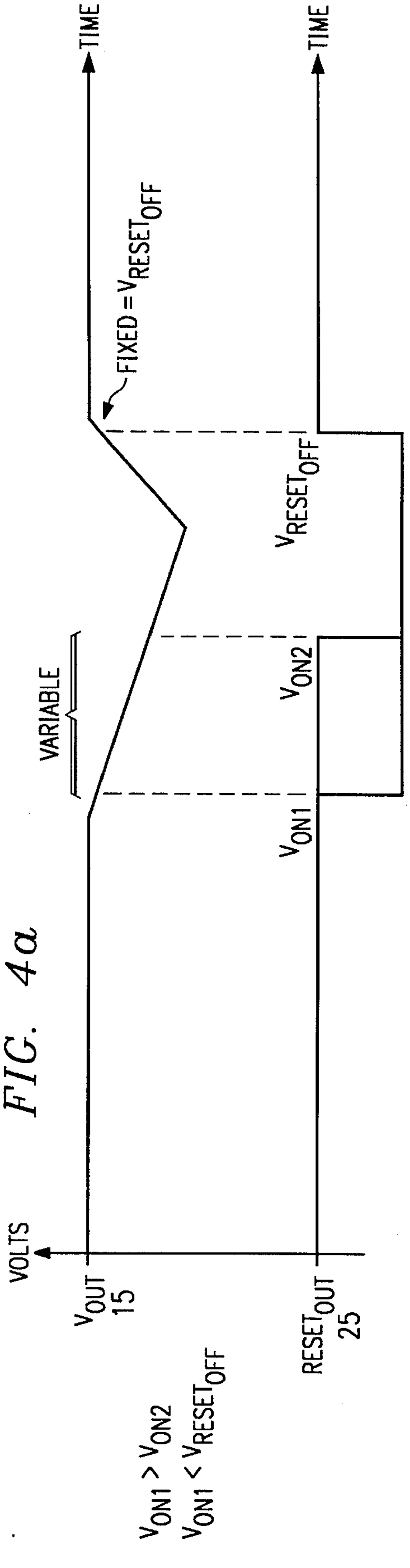
FIG. 4*a* is a timing diagram, according to the first preferred embodiment of the present invention.

FIG. 4*a* is a timing diagram of the first preferred embodiment of FIG. 2. Referring to FIG. 4*a*, the voltage levels of Vout signal 15 and Reset Out signal 25 are plotted in relation to each other over time. For purposes of the timing diagram, two levels of Vout signal 15 are shown: Von1 and Von2. It should be noted that the Vout signal 15 associated with Von1 is greater than that of Von2. Between these two voltage levels Von1 and Von2, Vout signal 15 is variable and is shown to be declining over time and Reset Out signal 25 is inactive. At the time Vout signal 15 reaches the voltage level of Von2, Reset Out signal 25 becomes active to serve as a warning that Op Amp 22 has been unsuccessful in attempting to keep voltage output signal 15 within its acceptable tolerance. Reset Out signal 25 remains active until Vout signal 15 has increased to within its range of acceptable value; at this time, Reset Out signal 25 becomes inactive (Voff).

Figure 4B:
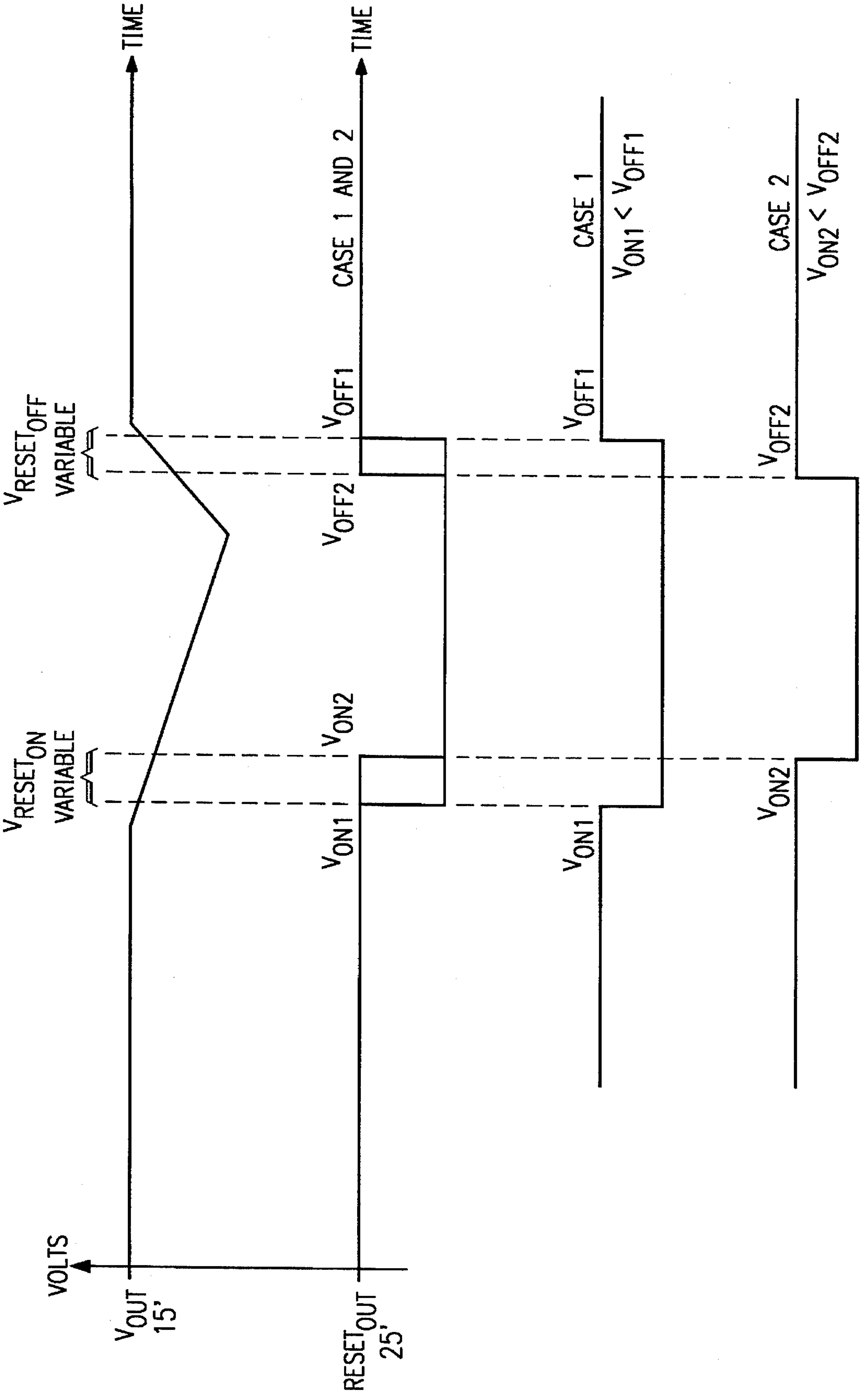
FIG. 4*b* is a timing diagram, according to the second preferred embodiment of the present invention.

FIG. 4*b* shows a similar timing diagram for the second preferred embodiment of FIG. 3. Referring to FIG. 4*b*, the voltage levels of Vout signal 15' and Reset Out signal 25' are plotted in relation to each other over time. Two levels of Vout signal 15 are shown: Von1 and Von2. In FIG. 4*a*, two cases are examined: Case 1 is where Von1 is less than Reset Out signal 25' (Voff1); case 2 is where Von2 is less than Reset Out signal 25' (Voff2).

While the invention has been particularly shown and described with reference to a preferred embodiment, it will be understood by those skilled in the art that various changes in form and detail may be made therein without departing from the spirit and scope of the invention.

What is claimed is:

1. An integrated regulator having an externally adjustable reset threshold, comprising:

a transistor contained within an integrated circuit device which is supplied with a voltage input signal from an external power supply;

a voltage reference block contained within the integrated circuit device which produces a voltage reference signal;

a first resistive network contained within the integrated circuit device;

an operational amplifier contained within the integrated circuit device having a first voltage reference input signal equal to the voltage reference signal, a second input signal controlled by the first resistive network, and an output signal; wherein the operational amplifier regulates a voltage output signal of the integrated regulator by regulating the current of the transistor in order to maintain the voltage output signal within an acceptable range of a desired value of the voltage output;

a comparator contained within the integrated circuit device having at least a first voltage reference input signal equal to the voltage reference signal, a second input signal, and a reset output signal, wherein the comparator senses if the operational amplifier is regulating the voltage output signal of the integrated regulator within the acceptable range of the desired value of the voltage output signal, and the reset output signal is equal to an inactive state when the operational amplifier is regulating the voltage output signal within the acceptable range of the desired value of the voltage output signal and the reset output signal is equal to an active state when the operational amplifier is not regulating the voltage output signal within the acceptable range of the desired value of the voltage output signal; and a second resistive network, contained outside the integrated circuit device and connected in series with the voltage output signal of the integrated regulator, which may be adjusted in order to change a value of a reset threshold of the integrated regulator wherein the reset threshold is defined as a trip point at which a given value of the voltage output signal will cause the reset output signal of the comparator to change from the inactive state to the active state or from the active state to the inactive state.

2. The structure of claim 1, wherein the transistor is a PNP transistor and the operational amplifier regulates the voltage output signal of the integrated regulator by regulating the base current of the PNP transistor.

3. The structure of claim 2, wherein the operational amplifier is an operational transconductance amplifier (OTA).

4. The structure of claim 1, wherein when the reset output signal of the comparator is equal to the active state, the reset threshold of the integrated regulator is determined by the voltage reference signal and the second resistive network.

5. The structure of claim 1, wherein when the reset output signal of the comparator is equal to the inactive state, the reset threshold of the integrated regulator is determined by the voltage reference signal and the first resistive network.

6. The structure of claim 1, wherein the comparator further comprises a third input signal, and the second input signal is controlled by the first resistive network and the third input signal is controlled by the second resistive network.

7. The structure of claim 1, wherein the second input signal of the comparator is controlled by the second resistive network.

8. The structure of claim 7, wherein the comparator is a two-input terminal operational amplifier.

9. The structure of claim 1, wherein the voltage output signal of the integrated regulator is provided to a microprocessor in order to avoid a false triggering condition of the microprocessor.

10. The structure of claim 1, wherein the comparator has hysteresis which allows the integrated regulator to operate in a noisy environment.

11. An integrated regulator having an externally adjustable reset threshold, comprising:

a transistor contained within an integrated circuit device which is supplied with a voltage input signal from an external power supply;

a voltage reference block contained within the integrated circuit device which produces a voltage reference signal;

a first resistive network contained within the integrated circuit device;

an operational amplifier contained within the integrated circuit device having a first voltage reference input signal equal to the voltage reference signal, a second input signal controlled by the first resistive network, and an output signal; wherein the operational amplifier regulates a voltage output signal of the integrated regulator by regulating the current of the transistor in order to maintain the voltage output signal within an acceptable range of a desired value of the voltage output;

a comparator contained within the integrated circuit device having at least a first voltage reference input signal equal to the voltage reference signal, a second input signal, and a reset output signal, wherein the comparator senses if the operational amplifier is regulating the voltage output signal of the integrated regulator within the acceptable range of the desired value of the voltage output signal, and the reset output signal is equal to an inactive state when the operational amplifier is regulating the voltage output signal within the acceptable range of the desired value of the voltage output signal and the reset output signal is equal to an active state when the operational amplifier is not regulating the voltage output signal within the acceptable range of the desired value of the voltage output signal; and means external to the integrated circuit device for adjusting a reset threshold of the integrated regulator, wherein the reset threshold is defined as a trip point at which a given value of the voltage output signal will cause the reset output signal of the comparator to change from the inactive state to the active state or from the active state to the inactive state.

12. The structure of claim 11, wherein the means for adjusting the reset threshold of the integrated regulator is a second resistive network connected in series with the voltage output signal.

13. The structure of claim 11, wherein the means for adjusting the reset threshold of the integrated regulator is a potentiometer.

14. A method for adjusting a reset threshold of an integrated regulator external to the integrated regulator, comprising the steps of:

monitoring a reset output signal of an integrated regulator, wherein the reset output signal is generated by a comparator of the integrated regulator contained within an integrated circuit device; and adjusting a resistive network which is external to the integrated circuit device when the reset output signal is equal to an active state and is thus indicative that a voltage output signal of the integrated regulator has not been regulated within an acceptable range of a desired value of the voltage output signal, wherein adjusting the resistive network adjusts a reset threshold of the integrated regulator defined as a trip point at which a given value of the voltage output signal will cause the reset output signal to change from active state to an inactive state or from the inactive state to the active state.

15. The method of claim 14, wherein an operational amplifier contained within the integrated circuit device regulates the voltage output signal of the integrated regulator by regulating a current of a transistor contained within the integrated circuit device in order to maintain the voltage output signal within an acceptable range of a desired value of the voltage output signal.

16. The method of claim 15, wherein the transistor is a PNP transistor and the operational amplifier regulates the voltage output signal of the integrated regulator by regulating the base current of the PNP transistor.

17. The method of claim 16, wherein the operational amplifier is an operational transconductance amplifier (OTA).

18. The method of claim 15, wherein the comparator has at least a first voltage reference input signal equal to a voltage reference signal produced by a voltage reference block contained within the integrated circuit device, a second input signal, and a reset output signal, wherein the comparator senses if the operational amplifier is regulating the voltage output signal of the integrated regulator within the acceptable range of the desired value of the voltage output signal.

19. The method of claim 18, wherein when the reset output signal of the comparator is equal to the active state, the reset threshold of the integrated regulator is determined by the voltage reference signal and the resistive network external to the integrated circuit device.

20. The method of claim 14, wherein the voltage output signal of the integrated regulator is provided to a microprocessor in order to avoid a false triggering condition of the microprocessor.

* * * * *